(12) United States Patent
Chang et al.

(10) Patent No.: US 10,950,531 B2
(45) Date of Patent: Mar. 16, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/427,193

(22) Filed: May 30, 2019

(65) Prior Publication Data

US 2020/0381348 A1    Dec. 3, 2020

(51) Int. Cl.
*H01L 23/498* (2006.01)
*H01L 21/48* (2006.01)
*H01L 21/683* (2006.01)

(52) U.S. Cl.
CPC ...... *H01L 23/49822* (2013.01); *H01L 21/481* (2013.01); *H01L 21/4853* (2013.01);
(Continued)

(58) Field of Classification Search
CPC ........ H05K 1/0268; H05K 1/09; H05K 3/064; H05K 3/467; H05K 3/4644; H05K 1/113; H01L 23/49822; H01L 21/481; H01L 21/4857; H01L 21/6835; H01L 23/49838; H01L 23/49866; H01L 24/03; H01L 24/08; H01L 21/486; H01L 2924/35121; H01L 2224/0401; H01L 2224/02373; H01L 2924/3511; H01L 2221/68359; H01L 2924/15311; H01L 2924/1517; H01L 24/81; H01L 2224/81005; H01L 2224/81444; H01L 2224/81191; H01L 24/13; H01L 24/16; H01L 2224/16227; H01L 2221/68345; H01L 2221/68368; H01L 23/3128; H01L 23/145;
(Continued)

(56) References Cited

U.S. PATENT DOCUMENTS

| 2003/0104183 A1* | 6/2003 | Narizuka | .......... H01L 23/49811 428/209 |
| 2010/0243300 A1* | 9/2010 | Amin | ...................... H05K 3/244 174/257 |

(Continued)

*Primary Examiner* — Steven T Sawyer
(74) *Attorney, Agent, or Firm* — Foley & Lardner LLP (57) ABSTRACT

A semiconductor device package includes a first dielectric layer, a conductive pad and an electrical contact. The first dielectric layer has a first surface and a second surface opposite to the first surface. The conductive pad is disposed within the first dielectric layer. The conductive pad includes a first conductive layer and a barrier. The first conductive layer is adjacent to the second surface of the first dielectric layer. The first conductive layer has a first surface facing the first surface of the first dielectric layer and a second surface opposite to the first surface. The second surface of the first conductive layer is exposed from the first dielectric layer. The barrier layer is disposed on the first surface of the first conductive layer. The electrical contact is disposed on the second surface of the first conductive layer of the conductive pad.

20 Claims, 11 Drawing Sheets

(52) U.S. Cl.
CPC ...... *H01L 21/4857* (2013.01); *H01L 21/6835* (2013.01); *H01L 23/49838* (2013.01); *H01L 2221/68359* (2013.01)

(58) Field of Classification Search
CPC ............. H01L 23/49816; H01L 23/522; H01L 23/528; H01L 23/53204; H01L 23/53252
See application file for complete search history.

(56) References Cited

U.S. PATENT DOCUMENTS

| | | | |
|---|---|---|---|
| 2010/0323474 A1* | 12/2010 | Miyazaki | H01L 21/4846 438/106 |
| 2012/0222894 A1* | 9/2012 | Kaneko | H05K 3/244 174/257 |
| 2013/0134127 A1* | 5/2013 | Kodani | H01L 21/4846 216/13 |
| 2014/0091473 A1* | 4/2014 | Len | H01L 25/0657 257/774 |
| 2014/0339699 A1* | 11/2014 | Arvin | H01L 23/49866 257/738 |
| 2016/0242285 A1* | 8/2016 | Katsuno | H05K 1/0271 |
| 2018/0138115 A1* | 5/2018 | Lu | H01L 21/6835 |
| 2019/0059153 A1* | 2/2019 | Liu | H05K 3/4644 |
| 2019/0267350 A1* | 8/2019 | Tajima | H01L 24/14 |

\* cited by examiner

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same, and to a semiconductor device package including a soldering pad structure and a method of manufacturing the same.

2. Description of the Related Art

A semiconductor package device may include solder balls that electrically connect an electronic component to a substrate. In a comparative semiconductor package device, solder balls may be directly bonded to copper pads. However, an intermetallic compound (IMC) layer may be formed between the solder balls and the copper pads, which may lead to a crack or void and in turn affect the connection between the solder balls and the copper pads.

SUMMARY

In one or more embodiments, a semiconductor device package includes a first dielectric layer, a conductive pad and an electrical contact. The first dielectric layer has a first surface and a second surface opposite to the first surface. The conductive pad is disposed within the first dielectric layer. The conductive pad includes a first conductive layer and a barrier. The first conductive layer is adjacent to the second surface of the first dielectric layer. The first conductive layer has a first surface facing the first surface of the first dielectric layer and a second surface opposite to the first surface. The second surface of the first conductive layer is exposed from the first dielectric layer. The barrier layer is disposed on the first surface of the first conductive layer. The electrical contact is disposed on the second surface of the first conductive layer of the conductive pad.

In one or more embodiments, a method of manufacturing a semiconductor device package includes (a) proving a carrier; (b) forming a first dielectric layer on the carrier, the first dielectric layer having an opening penetrating the first dielectric layer; (c) forming a first conductive layer within the opening; (d) forming a barrier layer within the opening and on the first conductive layer; and (e) forming an interconnection layer on the first dielectric layer and within the opening.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
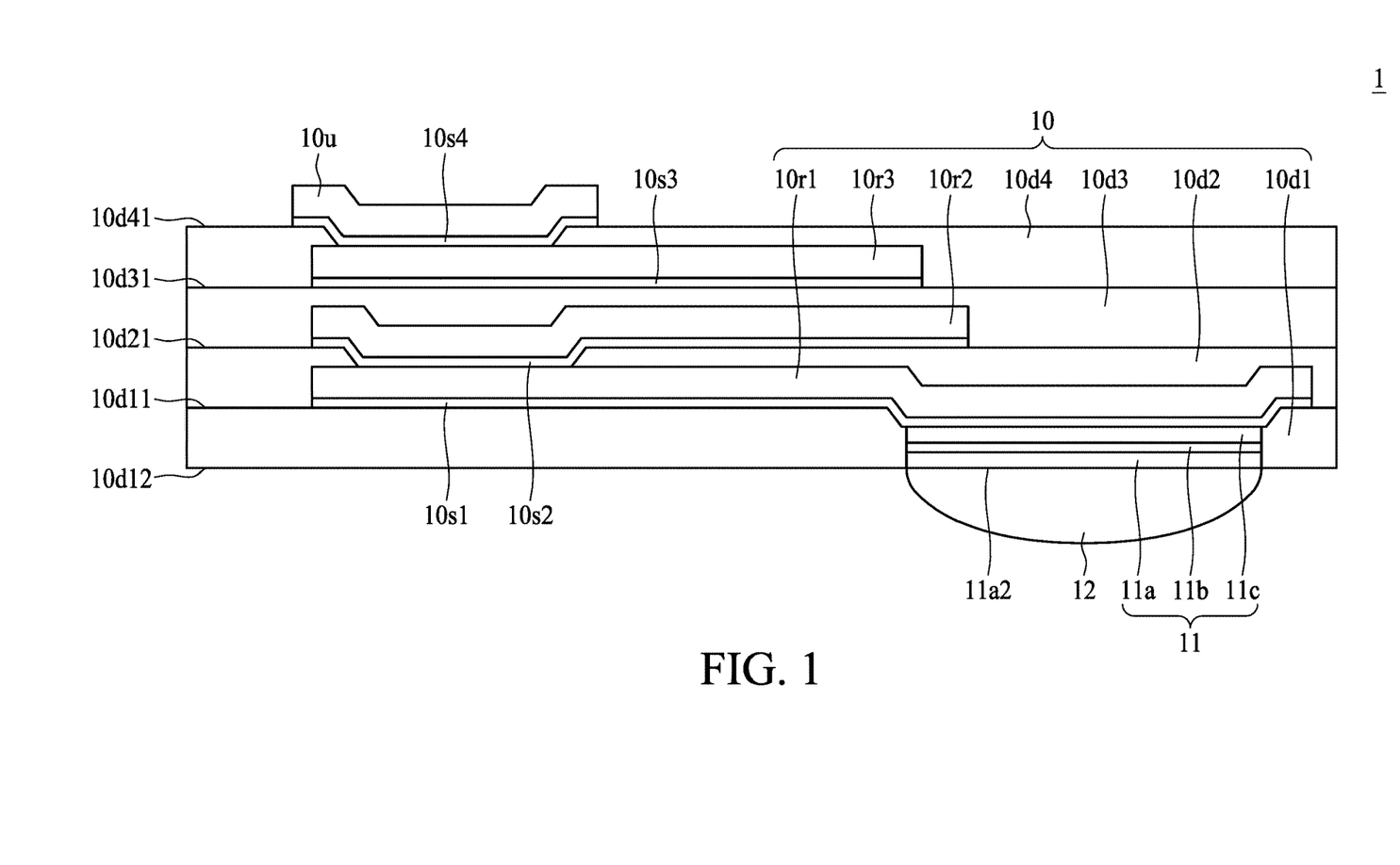
FIG. 1 illustrates a cross-sectional view of a semiconductor device package in accordance with some embodiments of the present disclosure.

FIG. 1 illustrates a cross-sectional view of a semiconductor device package 1 (or a portion of the semiconductor device package) in accordance with some embodiments of the present disclosure. The semiconductor package device 1 includes a circuit layer 10, a conductive pad 11 and an electrical contact 12.

The circuit layer 10 includes interconnection layers (e.g., redistribution layer, RDL) 10$r$1, 10$r$2, 10$r$3, 10$r$4 and dielectric layers 10$d$1, 10$d$2, 10$d$3, 10$d$4 (or passivation layers). A portion of of the interconnection layers 10$r$1, 10$r$2, 10$r$3, 10$r$4 is covered or encapsulated by the dielectric layer 10$d$1, 10$d$2, 10$d$3, 10$d$4 while another portion of the interconnection layer 10$r$1, 10$r$2, 10$r$3, 10$r$4 is exposed from the dielectric layer 10$d$1, 10$d$2, 10$d$3, 10$d$4 to provide electrical connections.

As shown in FIG. 1, the interconnection layer 10$r$1 is disposed on a surface 10$d$11 of the dielectric layer 10$d$1 and extending from the surface 10$d$11 of the dielectric layer 10$d$1 within the dielectric layer 10$d$1 to electrically connect to the conductive pad 11. The dielectric layer 10$d$2 is disposed on the surface 10$d$11 of the dielectric layer 10$d$1 and covers the interconnection layer 10$r$1. In some embodiments, a seed layer 10$s$1 may be disposed between the interconnection layer 10$r$1 and the dielectric layer 10$d$1, and between the interconnection layer 10$r$1 and the conductive pad 11.

The interconnection layer 10$r$2 is disposed on a surface 10$d$21 of the dielectric layer 10$d$2 and extending from the surface 10$d$21 of the dielectric layer 10$d$2 within the dielectric layer 10$d$2 to electrically connect to the interconnection layer 10$r$1. The dielectric layer 10$d$3 is disposed on the surface 10$d$21 of the dielectric layer 10$d$2 and covers the interconnection layer 10$r$2. In some embodiments, a seed layer 10$s$2 may be disposed between the interconnection layer 10r2 and the dielectric layer 10d2, and between the interconnection layer 10r1 and the interconnection layer 10r2.

The interconnection layer 10r3 is disposed on a surface 10d31 of the dielectric layer 10d3. In some embodiments, the interconnection layer 10r3 may extend from the surface 10d31 of the dielectric layer 10d3 within the dielectric layer 10d3 to electrically connect to the interconnection layer 10r2. The dielectric layer 10d4 is disposed on the surface 10d31 of the dielectric layer 10d3 and covers the interconnection layer 10r3. In some embodiments, a seed layer 10s3 may be disposed between the interconnection layer 10r3 and the dielectric layer 10d3. In some embodiments, the seed layer 10s3 may be disposed between the interconnection layer 10r2 and the interconnection layer 10r3.

A conductive layer 10u (e.g., an under bump metallurgy (UBM) layer) is disposed on a surface 10d41 of the dielectric layer 10d4 and extending from the surface 10d41 of the dielectric layer 10d4 within the dielectric layer to electrically connect to the interconnection layer 10r3. In some embodiments, a seed layer 10s4 may be disposed between the conducive layer 10u and the dielectric layer 10d4, and between the interconnection layer 10r3 and the conductive layer 10u.

In some embodiments, the dielectric layers 10d1, 10d2, 10d3 and 10d4 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layers 10d1, 10d2, 10d3 and 10d4 may include an inorganic material, such as silicon, a ceramic or the like. In some embodiments, the interconnection layers 10r1, 10r2, 10r3 and the conductive layer 10u include copper (Cu), gold (Au), silver (Ag), another metal, or an alloy thereof. In some embodiments, the seed layers 10s1, 10s2, 10s3 and 10s4 include titanium (Ti) and/or Cu. In some embodiments, the circuit layer 10 may include any number of interconnection layers and dielectric layers depending on design specifications. For example, the circuit layer 10 may include N interconnection layers and M dielectric layers, where N and M are integers equal to or greater than 1.

The conductive pad 11 (or UMB layer) is disposed within the dielectric layer 10d1. The conductive pad 11 is electrically connected to the interconnection layer 10r1. In some embodiments, the conductive pad 11 is in contact with the seed layer 10s1. A lateral surface of the conductive pad 11 is encapsulated or covered by the dielectric layer 10d1. For example, the lateral surface of the conductive pad 11 is in contact with the dielectric layer 10d1. A surface 11a2 of the conductive pad 11 is exposed from the dielectric layer 10d1. In some embodiments, the surface 11a2 of the conductive pad 11 is substantially coplanar with the surface 10d12 of the dielectric layer 10d1. In other embodiments, the surface 11a2 of the conductive pad 11 may be recessed from the surface 10d12 of the dielectric layer 10d1, and a depth of the recess is in a range from about 0.1 micrometer (μm) to about 0.2 μm. In some embodiments, a thickness of the conductive pad 11 is less than a thickness of the dielectric layer 10d1.

In some embodiments, the conductive pad 11 includes conductive layers 11a, 11b and 11c. The conductive layer 11a is in contact with the interconnection layer 10r1 or the seed layer 10s1. The conductive layer 11b is in contact with the conductive layer 11a. The conductive layer 11c is in contact with the conductive layer 11b. As shown in FIG. 1, the conductive layer 11b is disposed between the conductive layer 11a and the conductive layer 11c. For example, the conductive layer 11b is sandwiched by the conductive layer 11a and the conductive layer 11c. In some embodiments, the conductive layers 11a, 11b and 11c include the same width. Alternatively, the conductive layers 11a, 11b and 11c may include different widths depending on different design specifications.

In some embodiments, the conductive layer 11a and the conductive layer 11c include Cu, Ag, Au, another metal, or an alloy thereof. The conductive layer 11a and the conductive layer 11c may include the same or different materials depending on different design specifications. In some embodiments, the conductive layer 11b includes nickel (Ni), titanium tungsten (TiW), another metal, or an alloy thereof. In some embodiments, a thickness of the conductive layer 11b is equal to or greater than 2 μm. In some embodiments, the conductive layer 11b is provided as a barrier layer (or stop layer) to eliminate the formation of an IMC layer between the electrical contact 12 and the conductive layer 11c.

In some embodiments, the barrier layer (e.g., the conductive layer 11b) is omitted, and a solder ball is electrically connected to the Cu pad. In this case, an IMC layer may be formed at an interface (or boundary) between the solder ball and the Cu pad and extends within the Cu pad. If the thickness of the Cu pad is insufficient, the IMC layer would extend to the entire Cu pad, which would lead to a crack or void and in turn affect the connection between the solder ball and the Cu pad. In some embodiments, the above IMC issue may be eliminated or reduced by increasing the thickness of the Cu pad. However, this will increase the thickness of the semiconductor package and hinder the miniaturization of the semiconductor package.

In accordance with the embodiments as shown in FIG. 1, the conductive pad 11 (including the barrier layer (e.g., the conductive layer 11b) sandwiched by the conductive layers 11a and 11c) is electrically connected to the electrical contact 12 (e.g., solder ball). Even if an IMC layer may be formed at an interface (or boundary) between the conductive layer 11a and the electrical contact 12 and extends within the conductive layer 11a, the extension of the IMC layer would be blocked or stopped by the conductive layer 11b. For example, the conductive layer 11b can prevent the IMC layer from extending into the conductive layer 11c, so as to avoid the crack or void and to strengthen the connection between the conductive pad 11 and the electrical contact 12.

In addition, since the conductive pad 11 (e.g., UMB) is embedded within the dielectric layer 10d1, the lateral surface of the conductive pad 11 is protected by the dielectric layer 10d1. Hence, the conductive pad 11 has a relative better connection strength compared with a conductive pad disposed on or exposed from the dielectric layer 10d1. Furthermore, compared with the formation of the conductive pad on the dielectric layer, forming the conductive pad 11 within the dielectric layer 10d1 as shown in FIG. 1 will save 1 photoresist during the manufacturing process, which would reduce the manufacturing cost and time.

The electrical contact 12 (e.g. a solder ball) is disposed on the conductive pad 11 (e.g., on the conductive layer 11a of the conductive pad 11) and can provide electrical connections between the semiconductor device package 1 and external components (e.g. external circuits or circuit boards). In some embodiments, the electrical contact 12 includes a controlled collapse chip connection (C4) bump, a ball grid array (BGA) or a land grid array (LGA).

In some embodiments, one or more electronic components (active component or passive component) may be disposed on the circuit layer 10 and electrically connected to the circuit layer 10 (e.g., to the conductive layer 10*u*). In some embodiments, a molding compound may be disposed on the circuit layer 10 and covering the electronic components and the conductive layer 10*u*. In some embodiments, the semiconductor device package 1 in FIG. 1 can be connected or mounted to another circuit board through the electrical contact 12.

FIG. 2A, FIG. 2B, FIG. 2C, FIG. 2D, FIG. 2E, FIG. 2F, FIG. 2G, FIG. 2H, FIG. 2I and FIG. 2J are cross-sectional views of a semiconductor structure fabricated at various stages, in accordance with some embodiments of the present disclosure. At least some figures have been simplified for a better understanding of the aspects of the present disclosure.

Figure 2A:
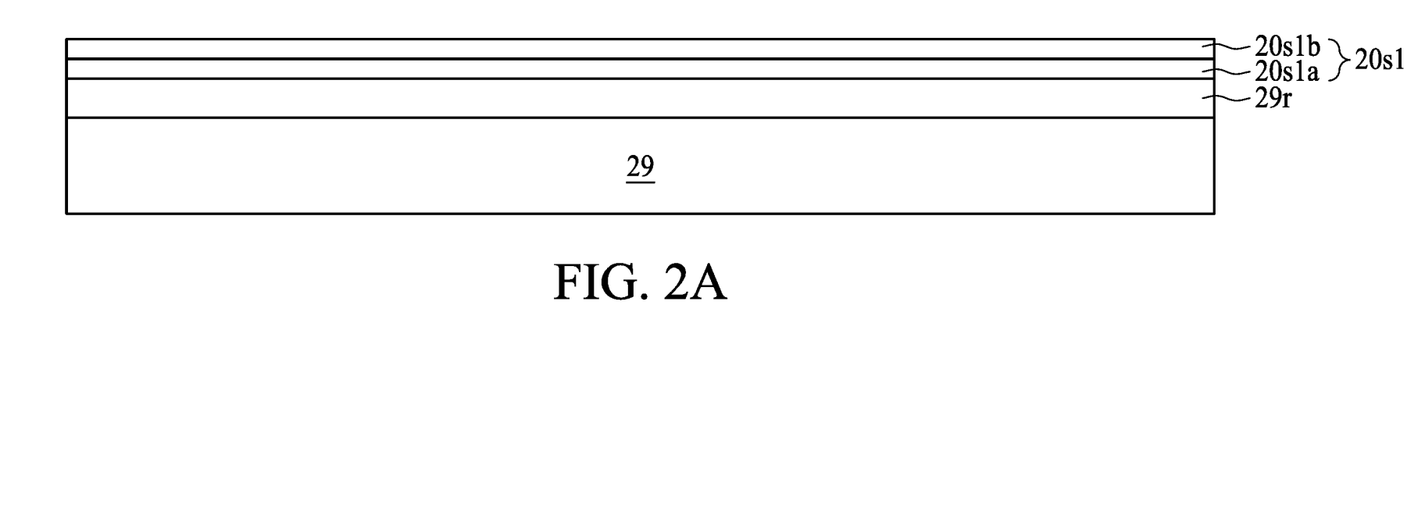
FIG. 2A illustrates one or more stages of a method of manufacturing a semiconductor package device in accordance with some embodiments of the present disclosure.

Referring to FIG. 2A, a carrier 29 is provided. The carrier 29 has an adhesion layer 29*r* (or release film) thereon. A seed layer 20*s*1 is formed on or attached to the adhesion layer 29*r*. In some embodiments, the seed layer 20*s*1 includes a Ti layer 20*s*1*a* and a Cu layer 20*s*1*b* (e.g., Ti/Cu alloy) or other suitable materials. In some embodiments, the seed layer 20*s*1 may be formed by physical vapor deposition (PVD) or other suitable processes.

Figure 2B:
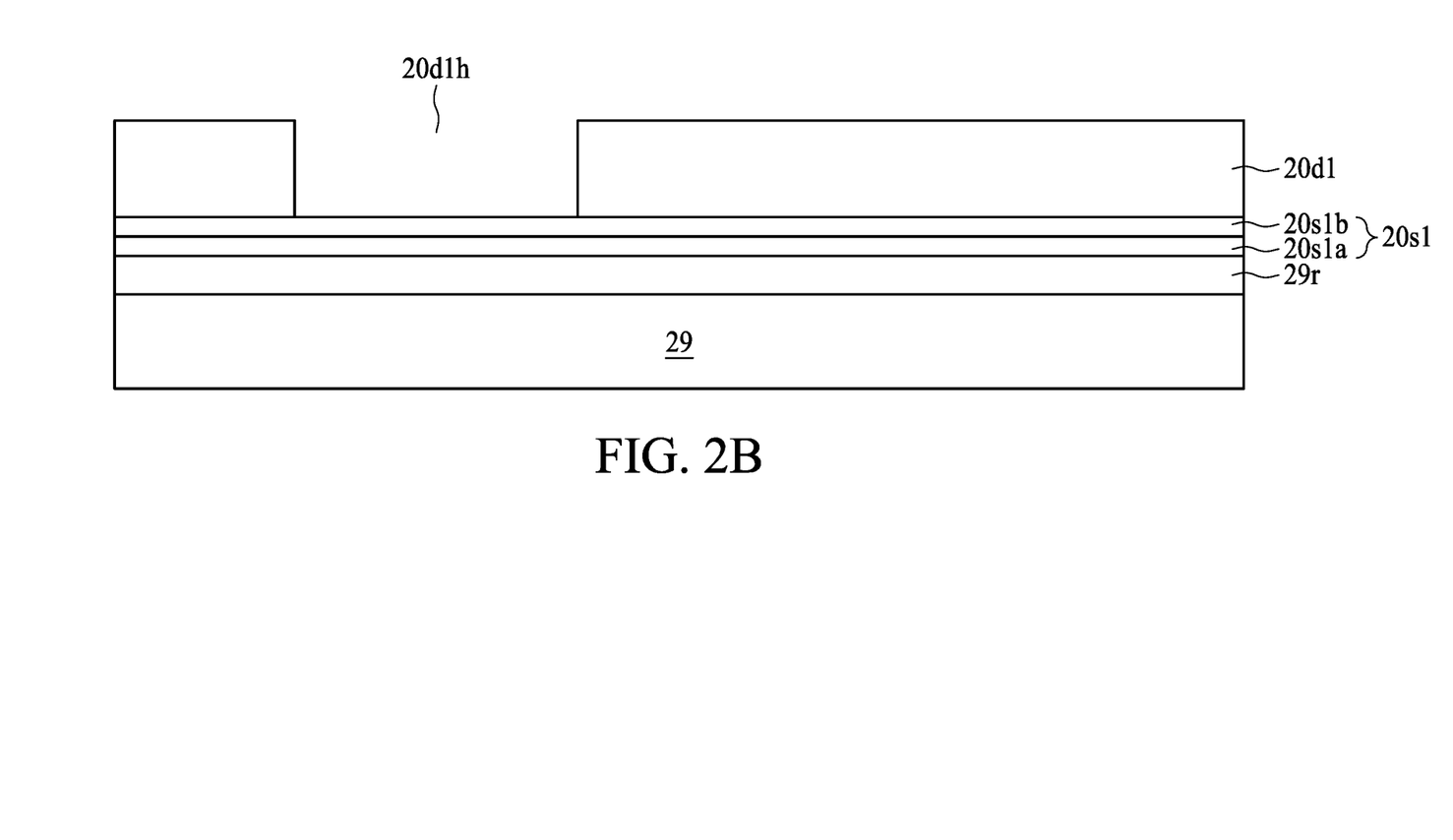
FIG. 2B illustrates one or more stages of a method of manufacturing a semiconductor package device in accordance with some embodiments of the present disclosure.

Referring to FIG. 2B, a dielectric layer 20*d*1 (or passivation layer) is formed on the seed layer 20*s*1. An opening 20*d*1*h* is formed to expose a portion of the seed layer 20*s*1. In some embodiments, the opening 20*d*1*h* can be formed by, for example, etching, laser or any other suitable processes. In some embodiments, the dielectric layer 20*d*1 is the same as or similar to the dielectric layer 10*d*1 in FIG. 1, and the dielectric layer 20*d*1 and the dielectric layer 10*d*1 may include the same properties.

Figure 2C:
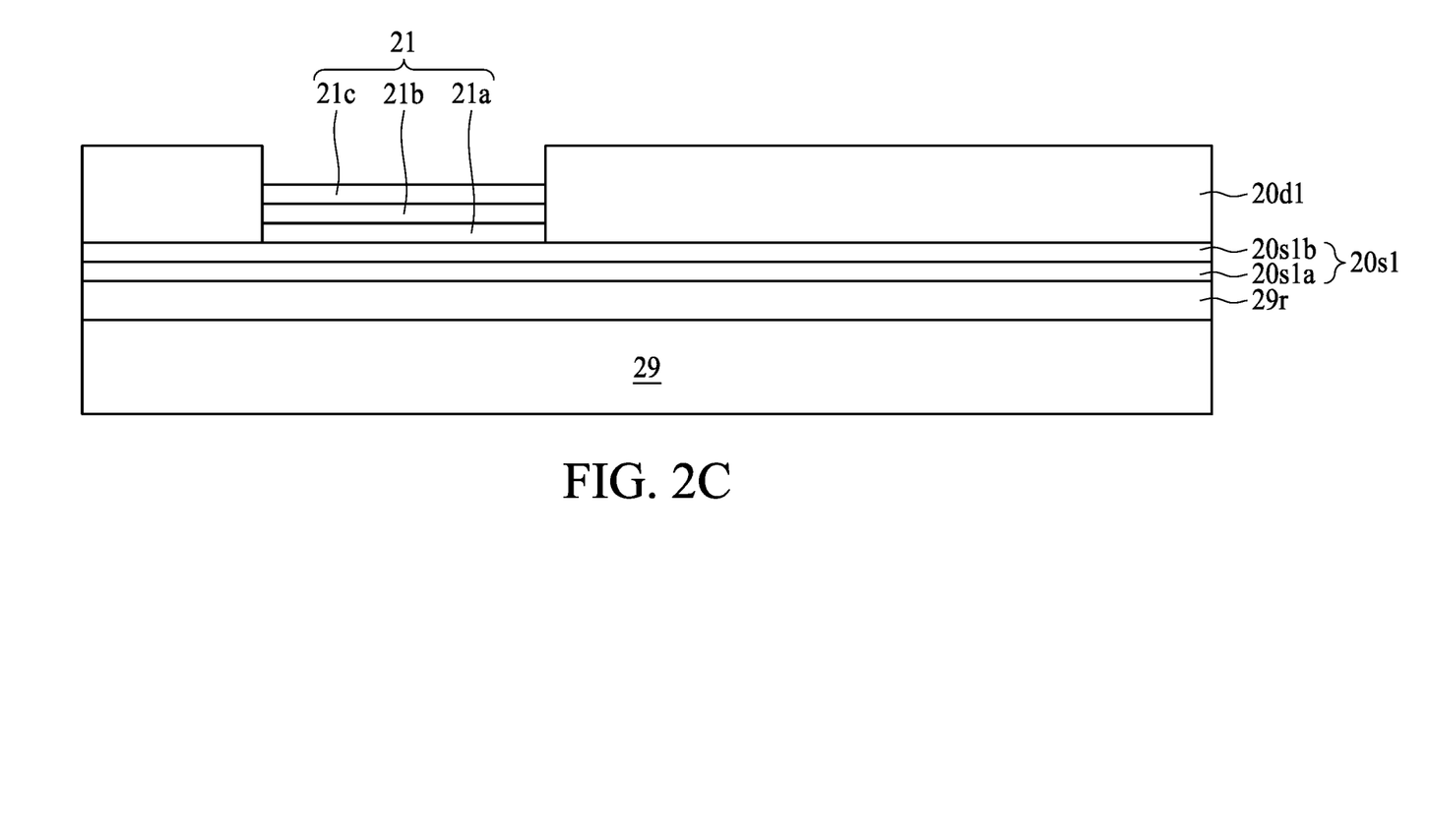
FIG. 2C illustrates one or more stages of a method of manufacturing a semiconductor package device in accordance with some embodiments of the present disclosure.

Referring to FIG. 2C, a conductive pad 21 is formed within the opening 20*d*1*h* and on the seed layer 20*s*1. In some embodiments, the conductive pad 21 (or UMB layer) includes conductive layers 21*a*, 21*b* and 21*c*. In some embodiments, the conductive layer 21*a* is formed on the seed layer 20*s*1, the conductive layer 21*b* is formed on the conductive layer 21*a*, and then the conductive layer 21*c* is formed on the conductive layer 21*b*. In some embodiments, a thickness of the conductive pad 21 is less than a depth of the opening 20*d*1*h*. In some embodiments, the conductive layers 21*a*, 21*b* and 21*c* are formed by, for example, plating or any other suitable processes.

In some embodiments, the conductive layer 21*a* and the conductive layer 21*c* include Cu, Ag, Au, another metal, or an alloy thereof. In some embodiments, the conductive layer 21*b* includes Ni, TiW, another metal, or an alloy thereof. In some embodiments, a thickness of the conductive layer 11*b* is equal to or greater than 2 μm. In some embodiments, the conductive layers 21*a*, 21*b* and 21*c* are respectively the same as or similar to the conductive layers 11*a*, 11*b* and 11*c* in FIG. 1, and the conductive layers 21*a*, 21*b* and 21*c* and the conductive layers 11*a*, 11*b* and 11*c* may include the same properties.

Figure 2D:
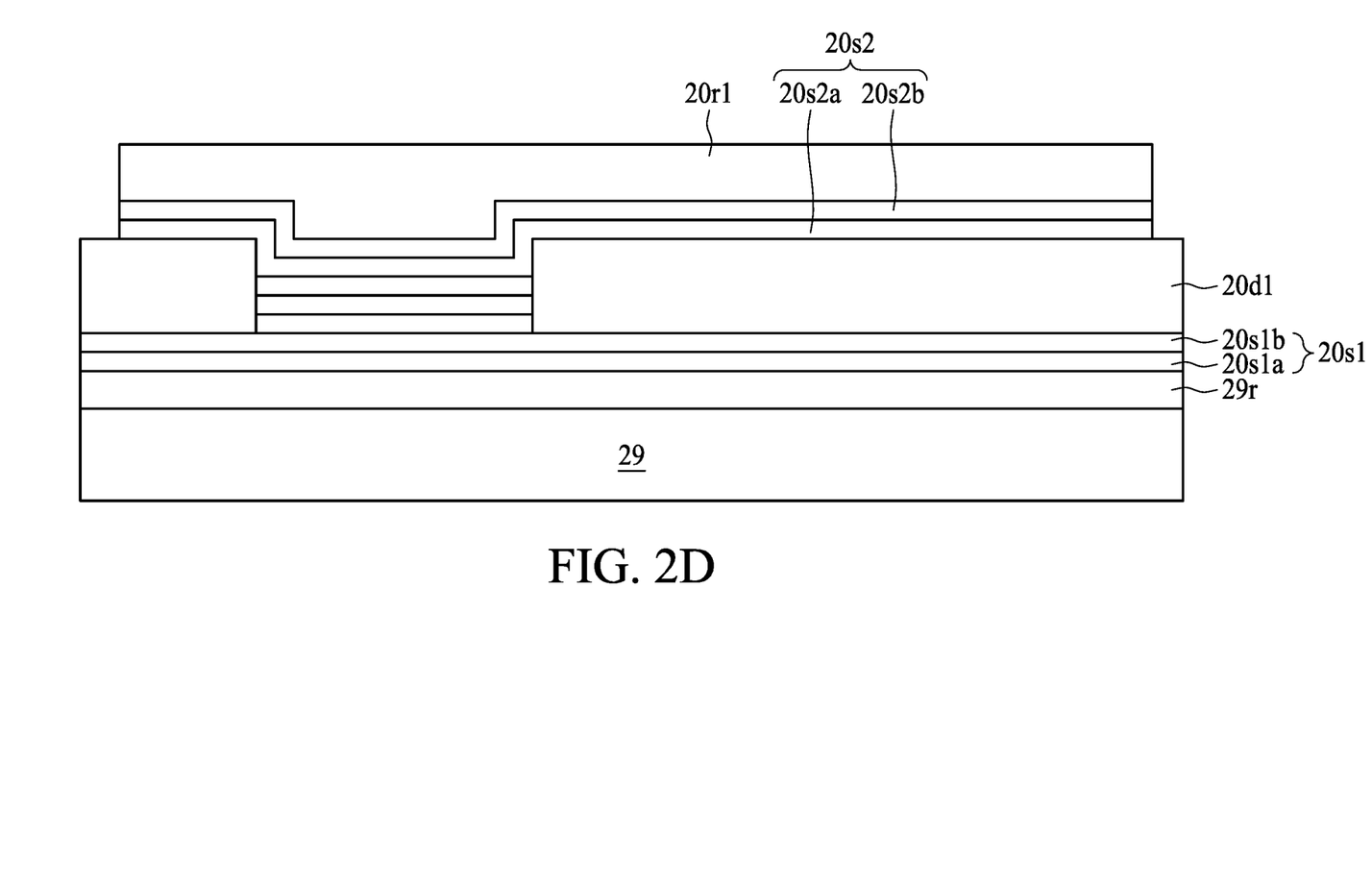
FIG. 2D illustrates one or more stages of a method of manufacturing a semiconductor package device in accordance with some embodiments of the present disclosure.

Referring to FIG. 2D, a seed layer 20*s*2 is formed on the dielectric layer 20*d*1. The seed layer 20*s*2 is also formed within the opening 20*d*1*h* and on the conductive pad 21 (e.g., on the conductive layer 21*c* of the conducive pad 21). In some embodiments, the seed layer 20*s*2 includes a Ti layer 20*s*2*a* and a Cu layer 20*s*2*b* (e.g., Ti/Cu alloy) or other suitable materials. In some embodiments, the seed layer 20*s*2 may be formed by PVD or other suitable processes. An interconnection layer 20*r*1 (e.g., RDL) is then formed on the seed layer 20*s*2 by, for example, plating or any other suitable processes.

Figure 2E:
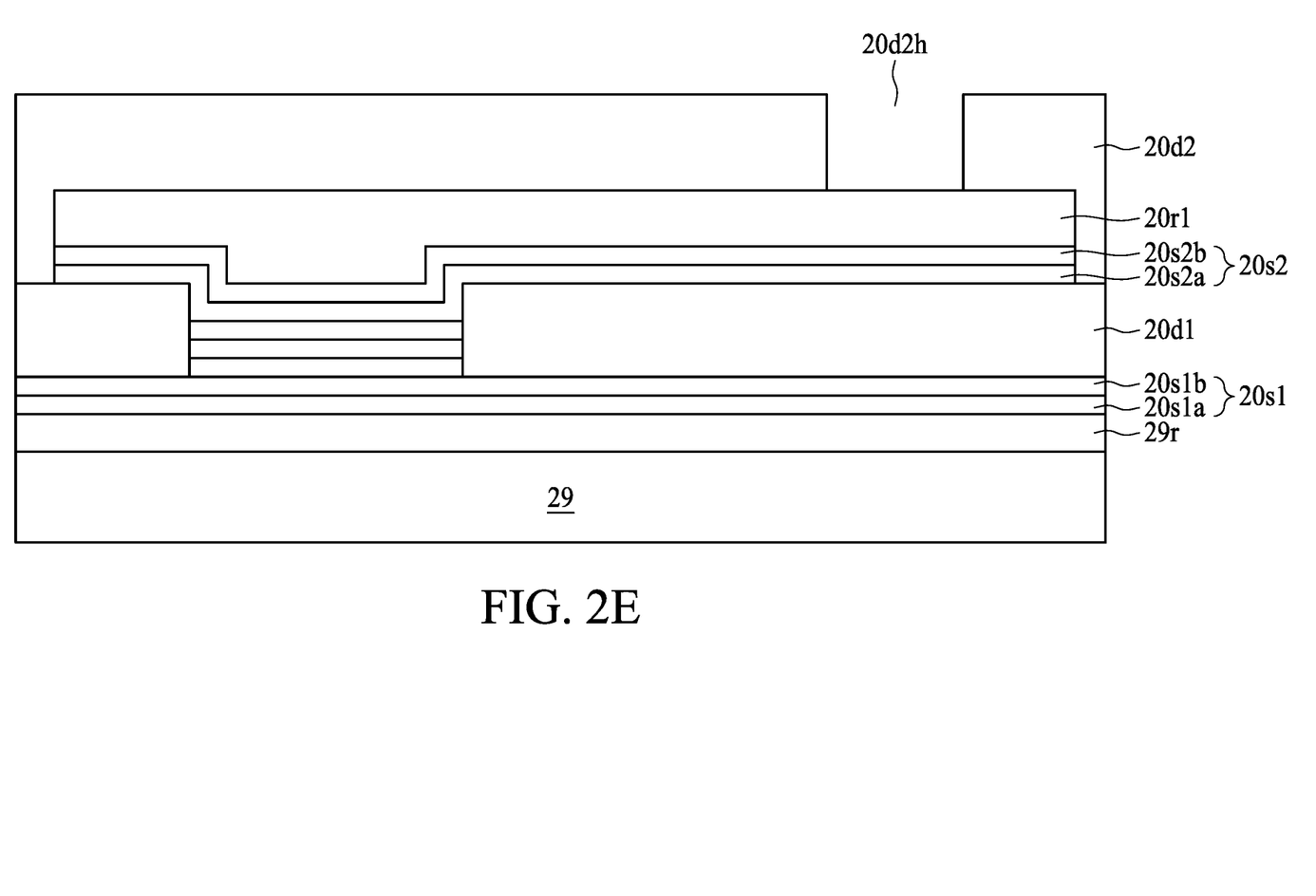
FIG. 2E illustrates one or more stages of a method of manufacturing a semiconductor package device in accordance with some embodiments of the present disclosure.

Referring to FIG. 2E, a dielectric layer 20*d*2 (or passivation layer) is formed on the dielectric layer 20*d*1 to cover the interconnection layer 20*r*1. An opening 20*d*2*h* is formed to expose a portion of the interconnection layer 20*r*1. In some embodiments, the opening 20*d*2*h* can be formed by, for example, etching, laser or any other suitable processes. In some embodiments, the dielectric layer 20*d*2 is the same as or similar to the dielectric layer 10*d*2 in FIG. 1, and the dielectric layer 20*d*2 and the dielectric layer 10*d*2 may include the same properties.

Referring to FIG. 2E, a seed layer 20*s*3 is formed on the dielectric layer 20*d*2. The seed layer 20*s*3 is also formed within the opening 20*d*2*h* and on the interconnection layer 20*r*1. In some embodiments, the seed layer 20*s*3 includes a Ti layer 20*s*3*a* and a Cu layer 20*s*3*b* (e.g., Ti/Cu alloy) or other suitable materials. In some embodiments, the seed layer 20*s*3 may be formed by PVD or other suitable processes. An interconnection layer 20*r*2 (e.g., RDL) is then formed on the seed layer 20*s*3 by, for example, plating or any other suitable processes.

Figure 2F:
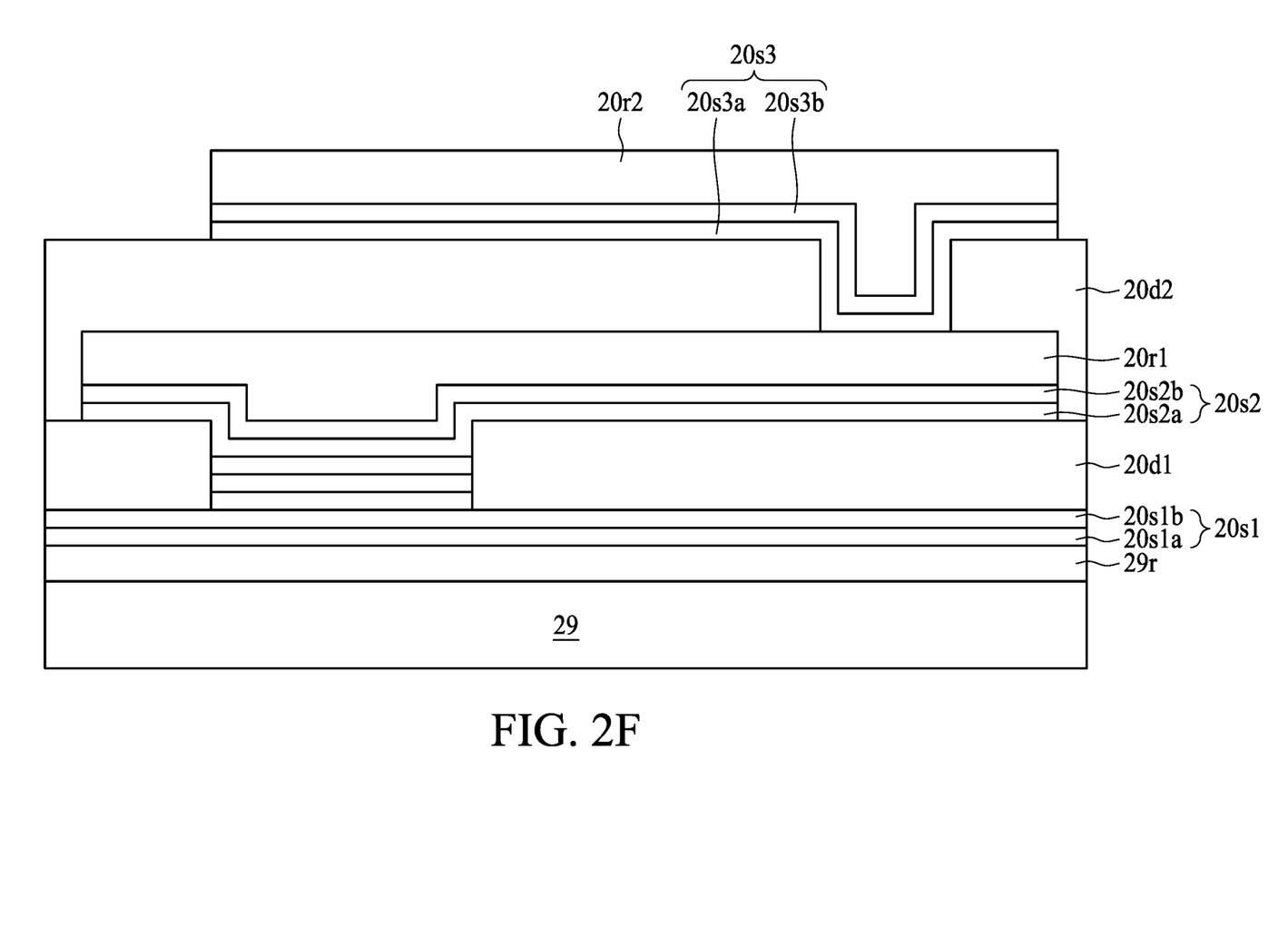
FIG. 2F illustrates one or more stages of a method of manufacturing a semiconductor package device in accordance with some embodiments of the present disclosure.
Figure 2G:
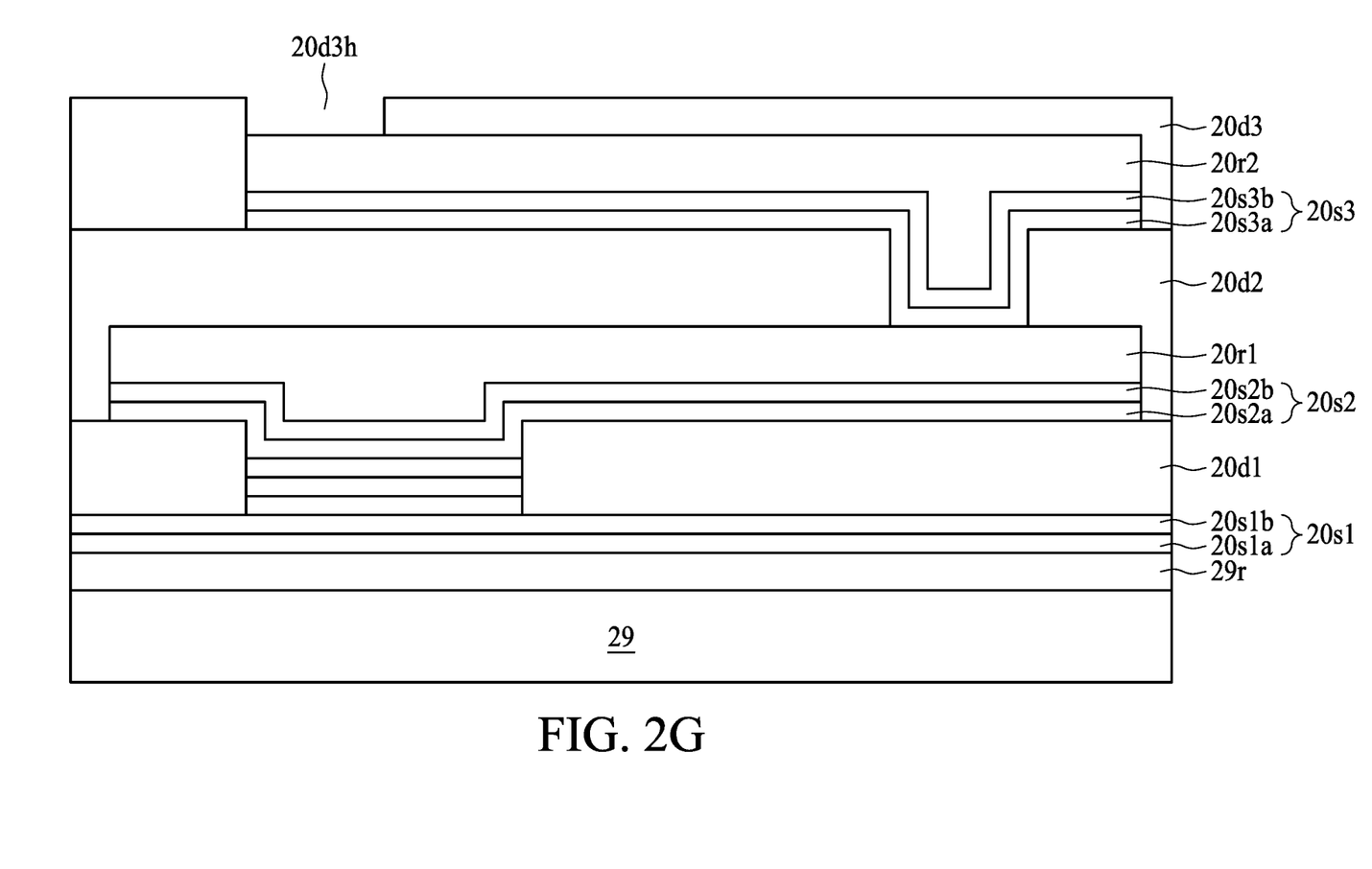
FIG. 2G illustrates one or more stages of a method of manufacturing a semiconductor package device in accordance with some embodiments of the present disclosure.

Referring to FIG. 2F, a dielectric layer 20*d*3 (or passivation layer) is formed on the dielectric layer 20*d*2 to cover the interconnection layer 20*r*2. An opening 20*d*3*h* is formed to expose a portion of the interconnection layer 20*r*2. In some embodiments, the opening 20*d*3*h* can be formed by, for example, etching, laser or any other suitable processes. In some embodiments, the dielectric layer 20*d*3 is the same as or similar to the dielectric layer 10*d*3 in FIG. 1, and the dielectric layer 20*d*3 and the dielectric layer 10*d*3 may include the same properties.

Figure 2H:
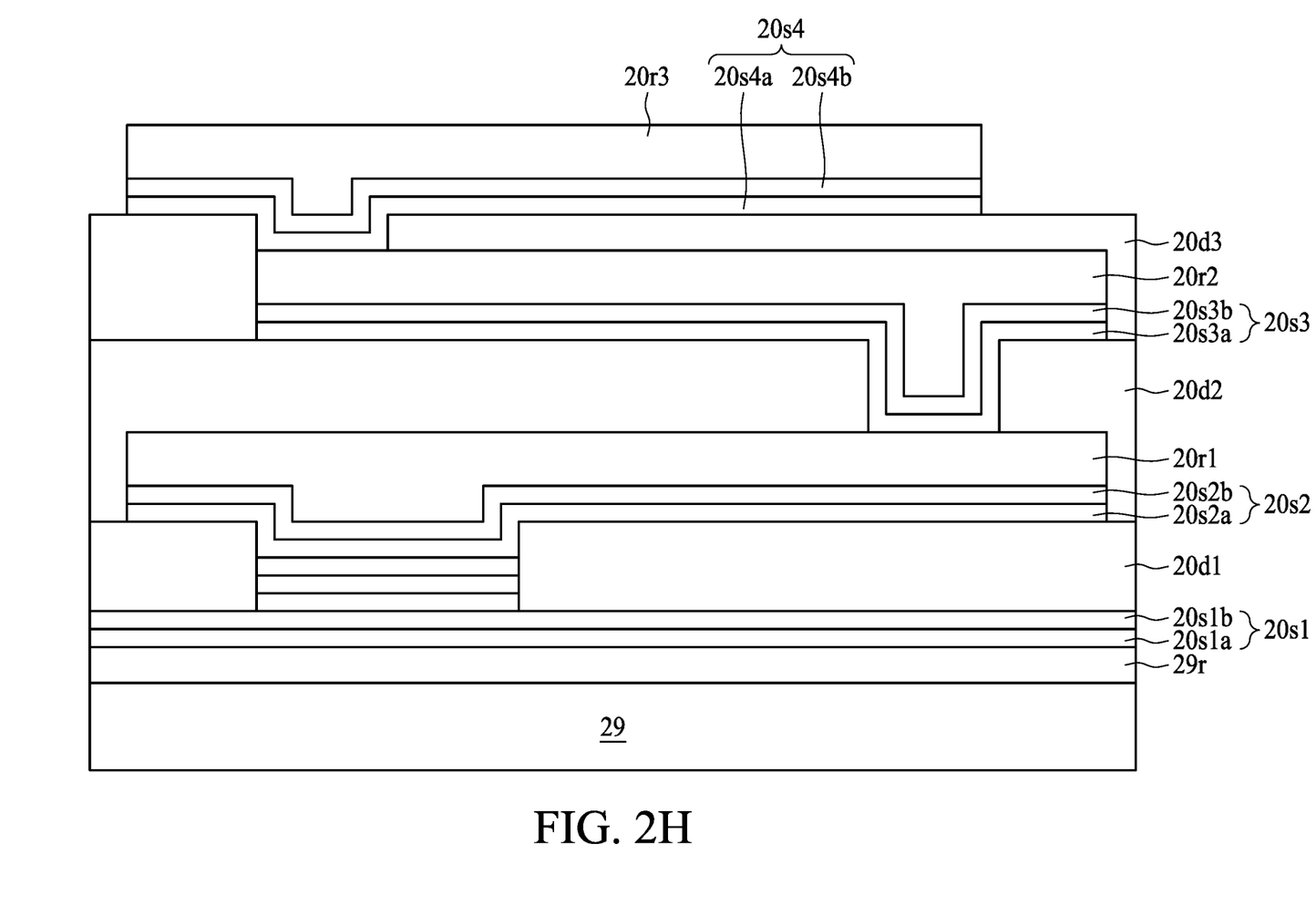
FIG. 2H illustrates one or more stages of a method of manufacturing a semiconductor package device in accordance with some embodiments of the present disclosure.

Referring to FIG. 2H, a seed layer 20*s*4 is formed on the dielectric layer 20*d*3. The seed layer 20*s*4 is also formed within the opening 20*d*3*h* and on the interconnection layer 20*r*2. In some embodiments, the seed layer 20*s*4 includes a Ti layer 20*s*4*a* and a Cu layer 20*s*4*b* (e.g., Ti/Cu alloy) or other suitable materials. In some embodiments, the seed layer 20*s*4 may be formed by PVD or other suitable processes. An interconnection layer 20*r*3 (e.g., RDL) is then formed on the seed layer 20*s*4 by, for example, plating or any other suitable processes.

Figure 2I:
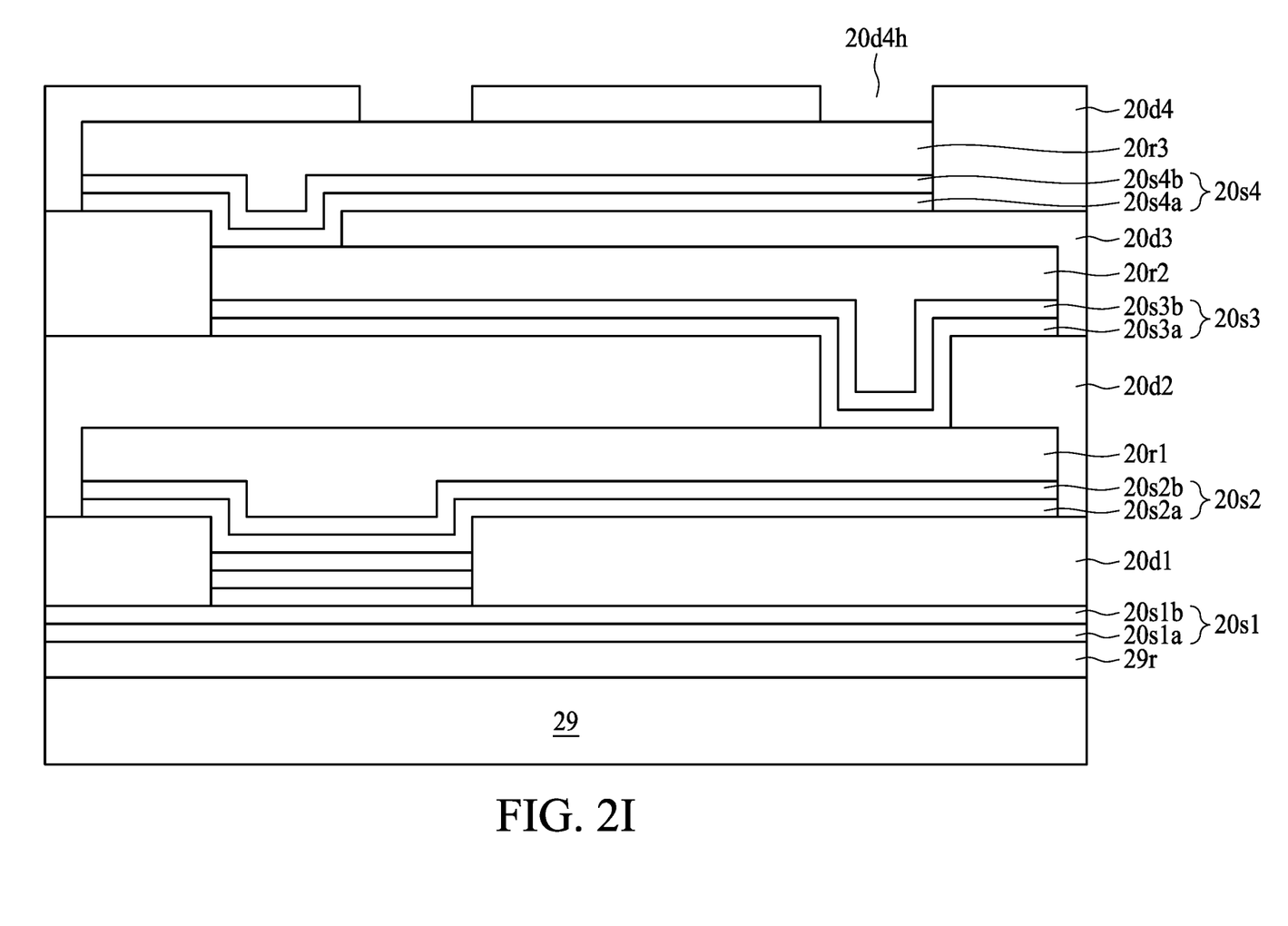
FIG. 2I illustrates one or more stages of a method of manufacturing a semiconductor package device in accordance with some embodiments of the present disclosure.

Referring to FIG. 2I, a dielectric layer 20*d*4 (or passivation layer) is formed on the dielectric layer 20*d*3 to cover the interconnection layer 20*r*3. An opening 20*d*4*h* is formed to expose a portion of the interconnection layer 20*r*3. In some embodiments, the opening 20*d*4*h* can be formed by, for example, etching, laser or any other suitable processes. In some embodiments, the dielectric layer 20*d*4 is the same as or similar to the dielectric layer 10*d*4 in FIG. 1, and the dielectric layer 20*d*4 and the dielectric layer 10*d*4 may include the same properties.

Referring to FIG. 2I, a seed layer 20*s*5 is formed on the dielectric layer 20*d*4. The seed layer 20*s*5 is also formed within the opening 20*d*4*h* and on the interconnection layer 20*r*3. In some embodiments, the seed layer 20*s*5 includes a Ti layer 20*s*5*a* and a Cu layer 20*s*5*b* (e.g., Ti/Cu alloy) or other suitable materials. In some embodiments, the seed layer 20*s*5 may be formed by PVD or other suitable processes. A conductive layer 20*u* (e.g., UMB layer) is then formed on the seed layer 20*s*5 by, for example, plating or any other suitable processes.

Figure 2J:
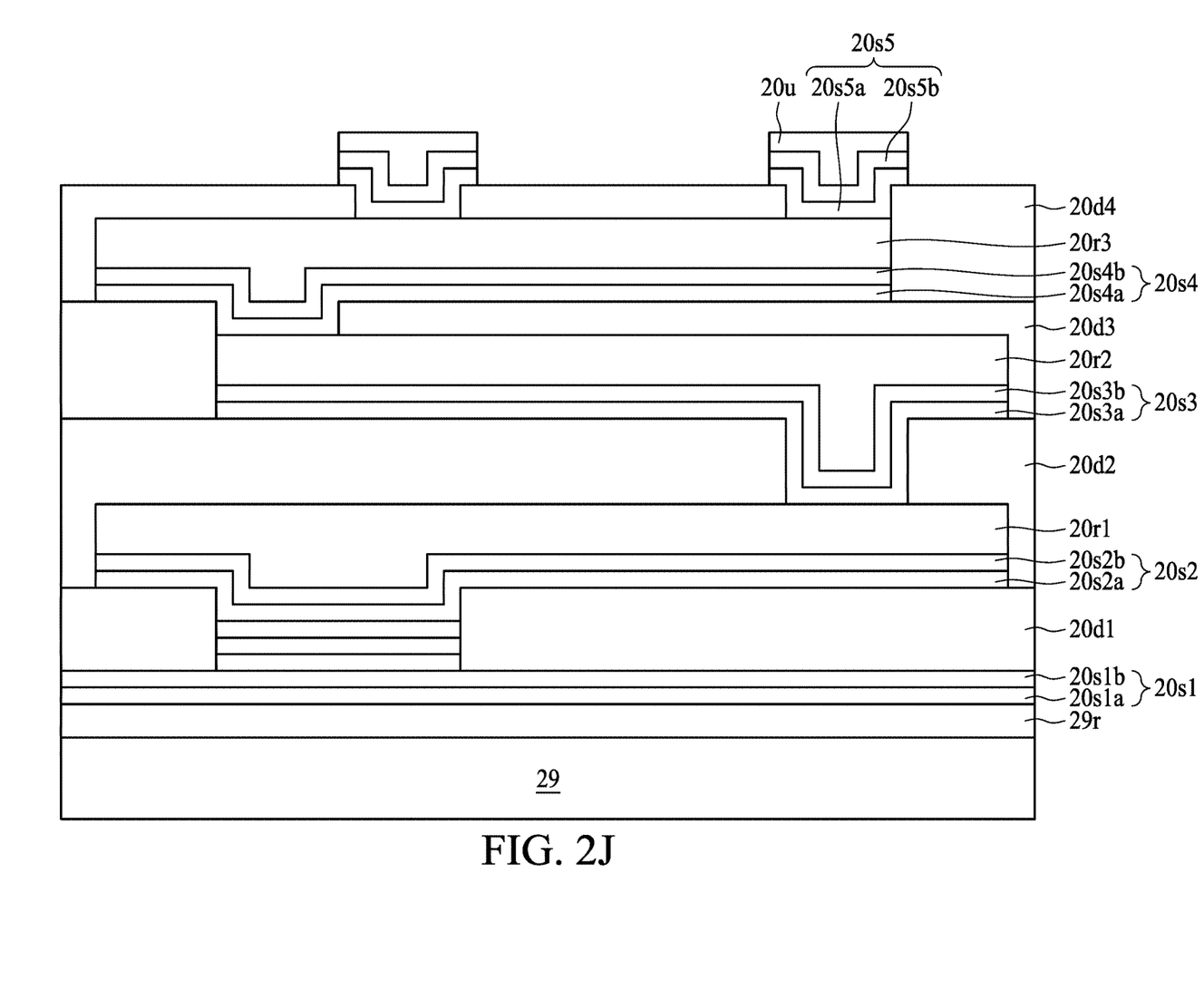
FIG. 2J illustrates one or more stages of a method of manufacturing a semiconductor package device in accordance with some embodiments of the present disclosure.

Then, the carrier 29 and the release film 29*r* are removed from the seed layer 20*s*1, and the seed layer 20*s*1 (including the Ti layer 20s1a and the Cu layer 20s1b) is removed to expose the conductive pad 21 (e.g., the conductive layer 21a of the conductive pad 21). In some embodiments, the seed layer 20s1 can be removed by, for example, etching or any other suitable processes. In some embodiments, after the seed layer 20s1 is removed, the exposed portion of the conductive layer 21a of the conductive pad 21 is substantially coplanar with a bottom surface of the dielectric layer 20d1. In other embodiments, when performing an etching operation to remove the seed layer 20s1, a portion of the conductive layer 21a of the conductive pad 21 may be removed as well. In this case, the conductive layer 21a of the conductive pad 21 may be recessed from a bottom surface of the dielectric layer 20d1. In some embodiments, a depth of the recess is in a range from about 0.1 µm to about 0.2 µm.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising
a first dielectric layer having a first surface and a second surface opposite to the first surface;
a conductive pad disposed within the first dielectric layer, the conductive pad comprising:
  a first conductive layer adjacent to the second surface of the first dielectric layer, the first conductive layer having a first surface facing the first surface of the first dielectric layer and a second surface opposite to the first surface, the second surface of the first conductive layer exposed from the first dielectric layer;
  a barrier layer disposed on the first surface of the first conductive layer; and
  a second conductive layer disposed on the barrier layer;
an electrical contact disposed on the second surface of the first conductive layer of the conductive pad;
an intermetallic compound (IMC) layer formed between the first conductive layer and the electrical contact,
a seed layer disposed on the first surface of the first dielectric layer;
a redistribution layer (RDL) disposed on the seed layer;
a second dielectric layer disposed on the first dielectric layer and partially covering the RDL,
a plurality of dielectric layers disposed on the second dielectric layer; and
an under bump metallurgy (UBM) layer protruding from the upmost dielectric layer of the dielectric layers and electrically connected to the RDL,
wherein both the seed layer and the RDL include recess structures, and the recess structure of the seed layer is in contact with the second conductive layer of the conductive pad, wherein an extension line of the second surface of the first dielectric layer passes through the IMC layer.

2. The semiconductor device package of claim 1, wherein the first conductive layer and the second conductive layer include copper (Cu), gold (Au) or silver (Ag).

3. The semiconductor device package of claim 1, wherein the second conductive layer is an intermetallic compound (IMC)-free layer.

4. The semiconductor device package of claim 1, wherein the barrier layer includes nickel (Ni) or titanium tungsten (TiW).

5. The semiconductor device package of claim 1, wherein the electrical contact includes a solder ball.

6. The semiconductor device package of claim 1, wherein a thickness of the barrier layer is equal to or greater than 2 micrometer (ρm).

7. The semiconductor device package of claim 1, wherein a recess defined by the second surface of the first conductive layer of the conductive pad and the second surface of the first dielectric layer is in range from about 0.1 μm to about 0.2 μm.

8. The semiconductor device package of claim 1, further comprising:
a first interconnection layer disposed on the first surface of the first dielectric layer and extending within the first dielectric layer to electrical contact to the conductive pad; and
a seed layer disposed between the first interconnection layer and the first surface of the first dielectric layer, and between the first interconnection layer and the conductive pad.

9. The semiconductor device package of claim 8, wherein the seed layer comprises a Ti layer on the conductive pad, and the Ti layer is in contact with the conductive pad and the first surface of the first dielectric layer.

10. A semiconductor device package, comprising
a first dielectric layer having a first surface and a second surface opposite to the first surface;
a conductive pad disposed within the first dielectric layer, the conductive pad comprising:
a first conductive layer having a first surface exposed from the first dielectric layer and a second surface opposite to the first surface;
a barrier layer disposed on the second surface of the first conductive layer; and
a second conductive layer disposed on the barrier layer;
an electrical contact disposed on the first surface of the first conductive layer of the conductive pad and adjacent to the first surface of the first dielectric layer; and
an intermetallic compound (IMC) layer formed between the first conductive layer and the electrical contact, the IMC layer being blocked by the barrier layer without extending into the second conductive layer,
a seed layer disposed on the second surface of the first dielectric layer;
a redistribution layer (RDL) disposed on the seed layer; and
a second dielectric layer disposed on the first dielectric layer and partially covering the RDL,
wherein both the seed layer and the RDL include recess structures,
wherein an extension line of the first surface of the first dielectric layer passes through the IMC layer.

11. The semiconductor device package of claim 10, wherein the first conductive layer, the second conductive layer and the barrier layer have a same width.

12. The semiconductor device package of claim 10, wherein the second conductive layer includes an intermetallic compound (IMC)-free layer.

13. The semiconductor device package of claim 1, wherein the first conductive layer and the second conductive layer include the same material.

14. The semiconductor device package of claim 3, wherein the IMC layer extends into the first conductive layer.

15. The semiconductor device package of claim 1, wherein the electrical contact is a solder ball for providing an electrical connection between the semiconductor device package and an external component.

16. The semiconductor device package of claim 10, wherein the electrical contact is a solder ball for providing an electrical connection between the semiconductor device package and an external component.

17. The semiconductor device package of claim 9, wherein the seed layer comprises a Cu layer on the Ti layer, and the Cu layer is in contact with the first interconnection layer.

18. The semiconductor device package of claim 1, further comprising a seed layer disposed between the UBM layer and the upmost dielectric layer, wherein the seed layer further extends within the upmost dielectric layer.

19. The semiconductor device package of claim 1, further comprising a molding compound disposed on the UBM, wherein an electronic component is disposed on and electrically connected to the UBM, and wherein the molding compound covers the electronic component and the UBM.

20. A semiconductor device package, comprising
a first dielectric layer having a first surface and a second surface opposite to the first surface;
a conductive pad disposed within the first dielectric layer, the conductive pad comprising:
a first conductive layer adjacent to the second surface of the first dielectric layer, the first conductive layer having a first surface facing the first surface of the first dielectric layer and a second surface opposite to the first surface, the second surface of the first conductive layer exposed from the first dielectric layer;
a barrier layer disposed on the first surface of the first conductive layer; and
a second conductive layer disposed on the barrier layer;
an electrical contact disposed on the second surface of the first conductive layer of the conductive pad;
an intermetallic compound (IMC) layer formed between the first conductive layer and the electrical contact;
a first seed layer disposed on the first surface of the first dielectric layer;
a first redistribution layer (RDL) disposed on the seed layer;
a second dielectric layer disposed on the first dielectric layer and partially exposing the first seed layer and the first RDL;
a second seed layer disposed on the second dielectric layer;
a second RDL disposed on the second seed layer;
a third dielectric layer disposed on the second dielectric layer and partially exposing the second seed layer;
a third seed layer disposed on the third dielectric layer;
a third RDL disposed on the third seed layer;
a fourth dielectric layer disposed on the third dielectric layer and partially exposing the third RDL;

an under bump metallurgy (UBM) layer protruding from the fourth dielectric layer and being electrically connected to the third RDL, wherein the first seed layer, the second seed layer, the first RDL, and the second RDL include recess structures, and the recess structure of the first RDL is in contact with the second conductive layer of the conductive pad, and wherein a lateral surface of the IMC layer is perpendicular to the second surface of the first dielectric layer.

\* \* \* \* \*